United States Patent [19]

Gooch

[11] Patent Number: 5,227,939
[45] Date of Patent: Jul. 13, 1993

[54] SCANNING TRANSDUCER HAVING TRANSVERSE INFORMATION AND CONTROL FLUX PATHS FOR REDUCED INTERFERENCE BETWEEN FLUXES

[75] Inventor: Beverley R. Gooch, Sunnyvale, Calif.

[73] Assignee: Ampex Corporation, Redwood City, Calif.

[21] Appl. No.: 31,713

[22] Filed: Mar. 27, 1987

Related U.S. Application Data

[63] Continuation-in-part of Ser. No. 715,211, Mar. 22, 1985, abandoned, Ser. No. 829,592, Feb. 13, 1986, Ser. No. 843,453, Mar. 24, 1986, Ser. No. 85,676, Aug. 6, 1987, and Ser. No. 128,115, Aug. 6, 1987, Pat. No. 4,985,795, said Ser. No. 715,211, is a continuation-in-part of Ser. No. 641,817, Aug. 16, 1984, abandoned, said Ser. No. 829,592, is a continuation-in-part of Ser. No. 641,817, Aug. 16, 1984, said Ser. No. 843,453, is a continuation-in-part of Ser. No. 715,211, Aug. 16, 1984, Ser. No. 829,592, Aug. 16, 1984, Ser. No. 808,588, Dec. 13, 1985, abandoned, and Ser. No. 808,924, Dec. 13, 1985, abandoned, said Ser. No. 808,588, is a continuation-in-part of Ser. No. 715,211, Dec. 13, 1985, said Ser. No. 85,676, and Ser. No. 128,115, each is a continuation-in-part of Ser. No. 715,211, Dec. 13, 1985, Ser. No. 808,588, Dec. 13, 1985, Ser. No. 808,924, Dec. 13, 1985, Ser. No. 829,592, Dec. 13, 1985, and Ser. No. 843,453, Dec. 13, 1985.

[51] Int. Cl.[5] .................... G11B 5/245; G11B 5/127; G11B 5/17
[52] U.S. Cl. .................... 360/115; 360/123; 360/125
[58] Field of Search ............ 360/115, 119, 120, 123, 360/125, 137, 55, 128

[56] References Cited

U.S. PATENT DOCUMENTS

| | | | |
|---|---|---|---|
| 3,084,227 | 4/1963 | Peters | 360/115 |
| 3,152,225 | 10/1964 | Peters | 360/115 |
| 3,175,049 | 3/1965 | Gabor | 360/115 |
| 3,188,399 | 6/1965 | Eldridge | 360/115 |
| 3,391,254 | 7/1968 | Honig | 360/115 |
| 3,435,440 | 3/1969 | Nallin | 360/115 |
| 3,555,204 | 1/1971 | Braun | 360/115 |
| 3,696,216 | 10/1972 | Sugaya et al. | 360/115 |
| 3,845,503 | 10/1974 | Kanai | 360/115 |
| 3,893,187 | 7/1975 | Kanai et al. | 360/115 |

FOREIGN PATENT DOCUMENTS 1065876 12/1981 U.S.S.R. .

Primary Examiner—Robert S. Tupper
Attorney, Agent, or Firm—Elizabeth E. Strnad; James A. LaBarre; C. Michael Zimmerman

[57] ABSTRACT

A preferred embodiment of an electromagnetically controlled scanning magnetic transducer is described having two confronting core poles defining a physical transducing gap therebetween. A control winding is associated with each core pole. A control current applied to each control winding selectively saturates a portion of each core pole facing a record medium. Each saturated face portion defines an adjacent unsaturated highly permeable face portion. The highly permeable face portions of each core pole overlap across the gap to define a transducing zone. The information signal and control windings are arranged relative to one another to obtain information signal and control flux paths extending perpendicular to one another.

52 Claims, 7 Drawing Sheets

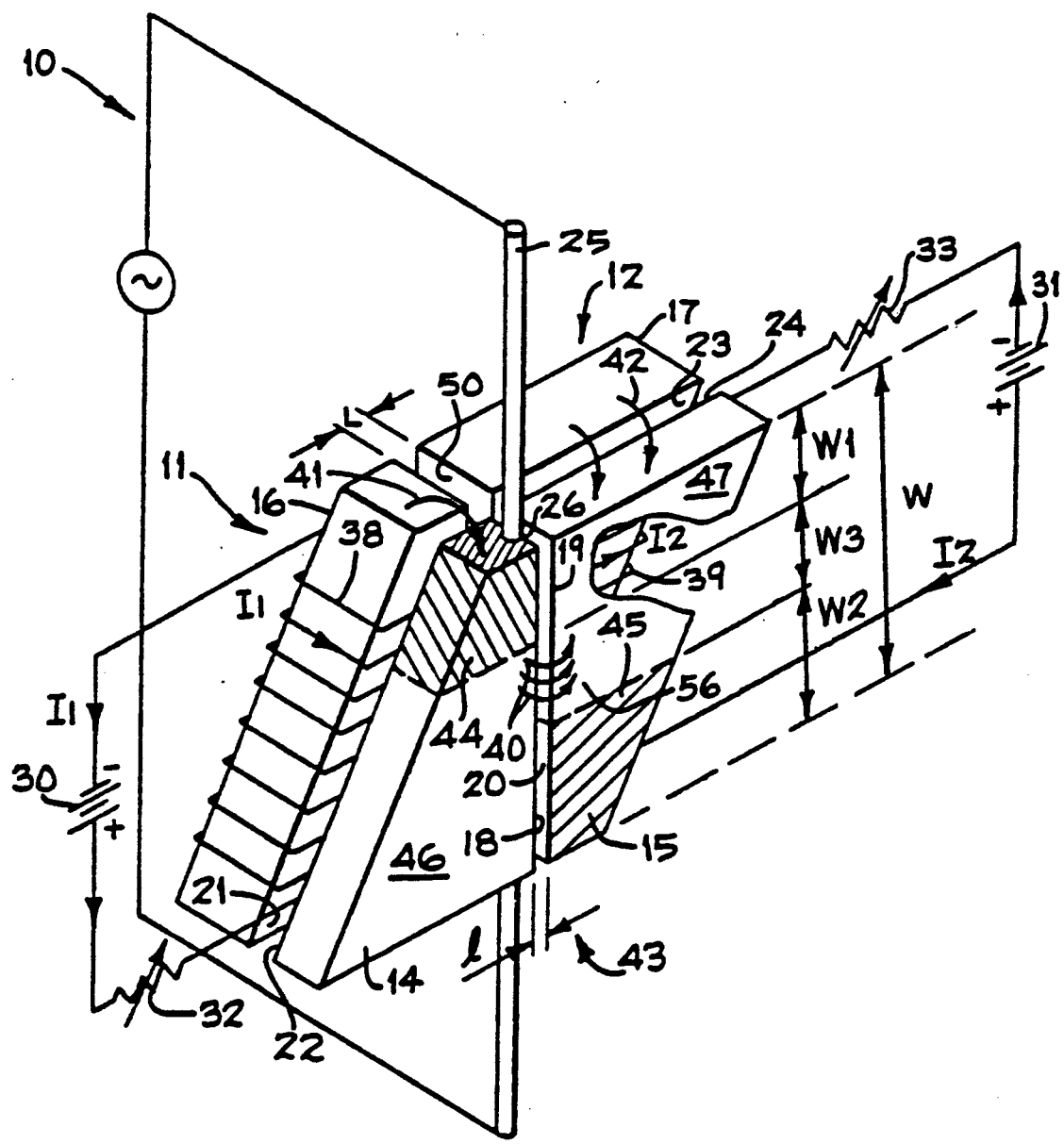
FIG_1A

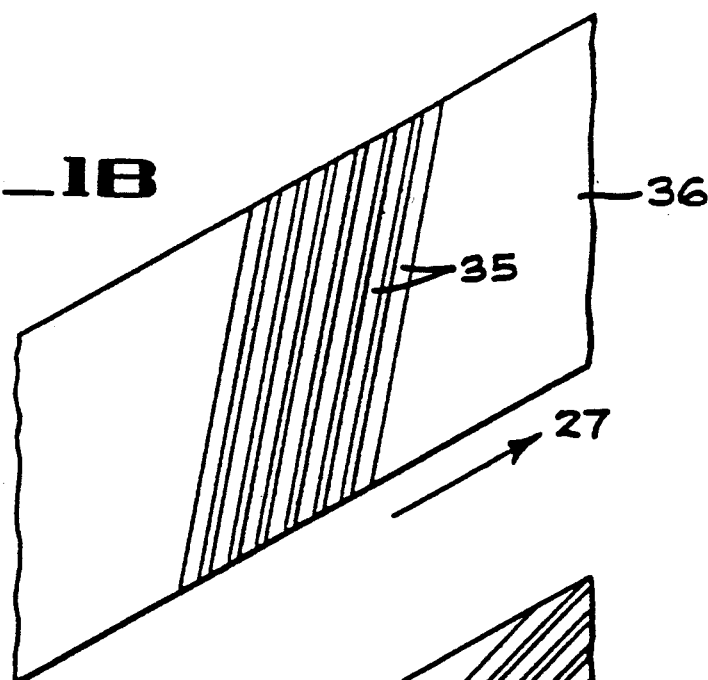
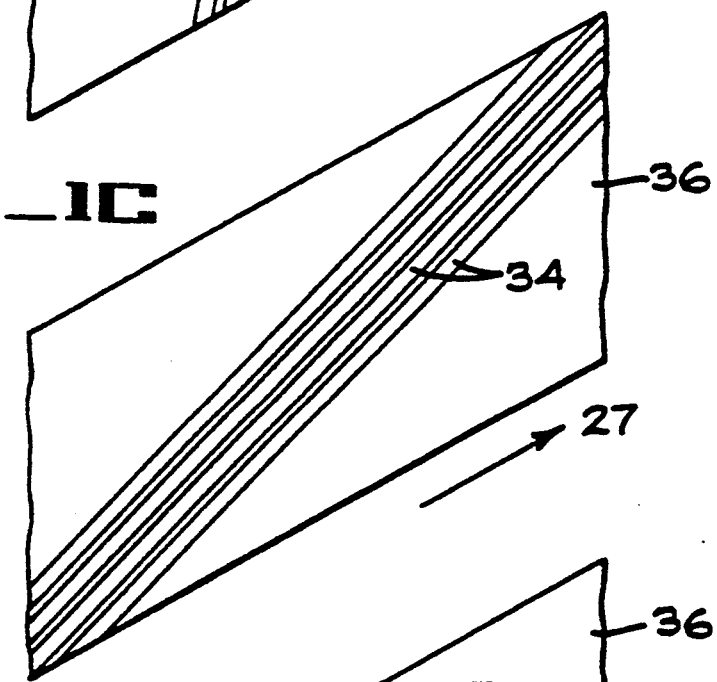
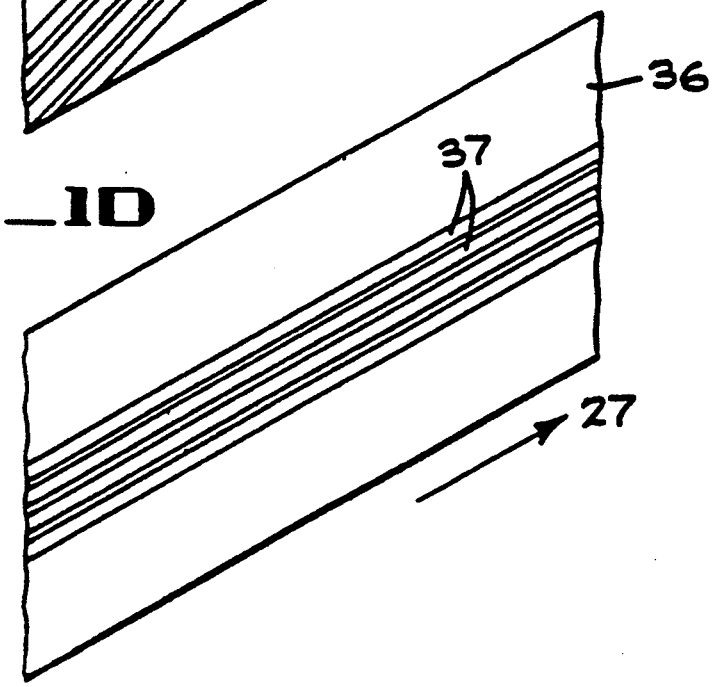

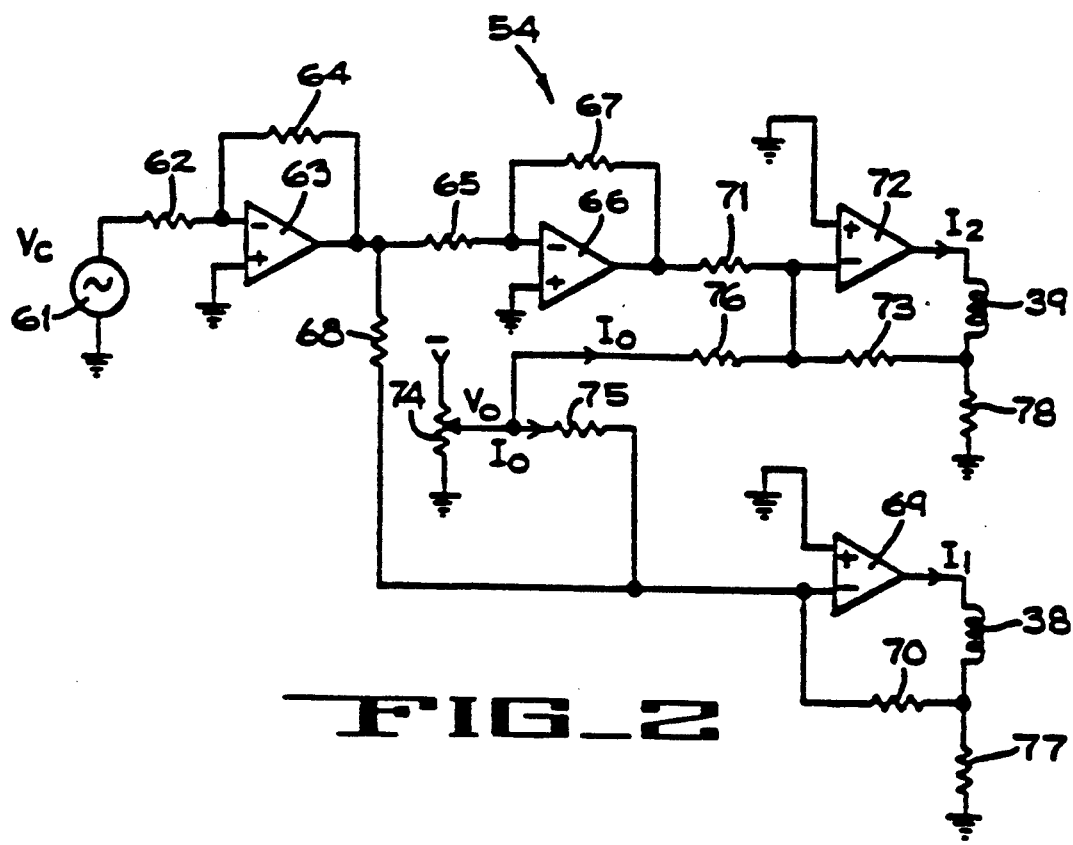
FIG_2
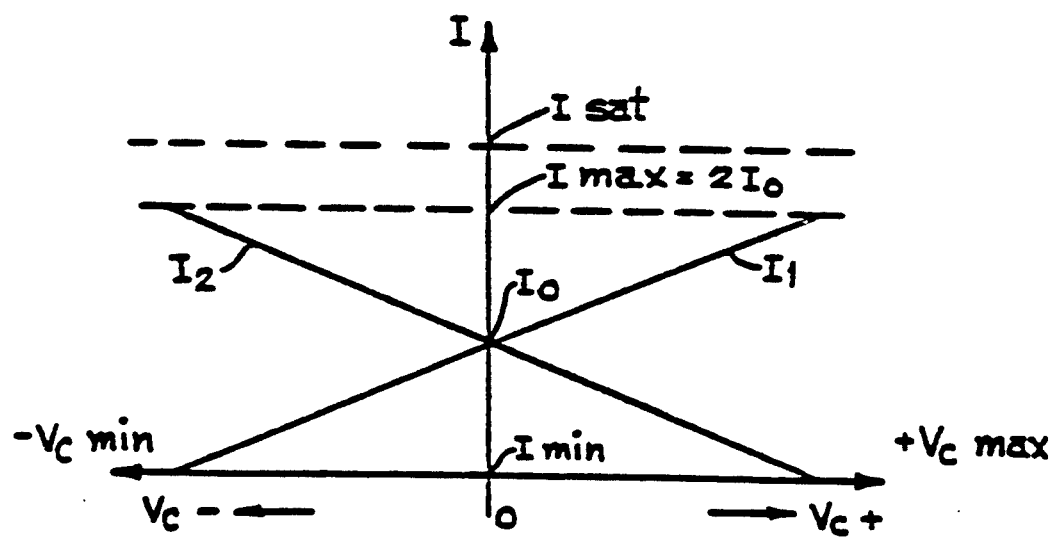
FIG_3

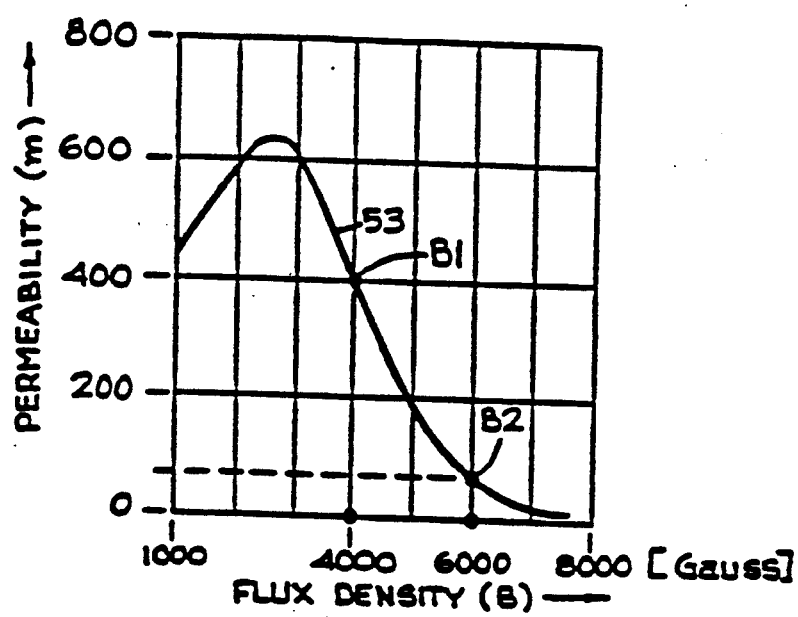
FIG_4
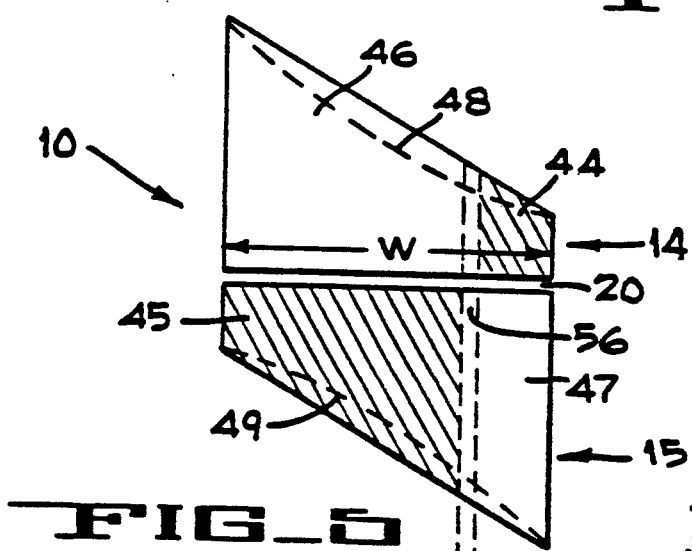
FIG_5
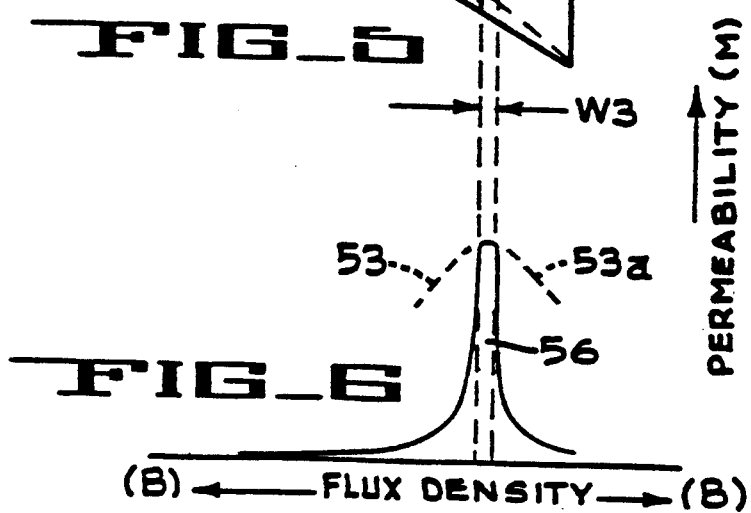
FIG_6

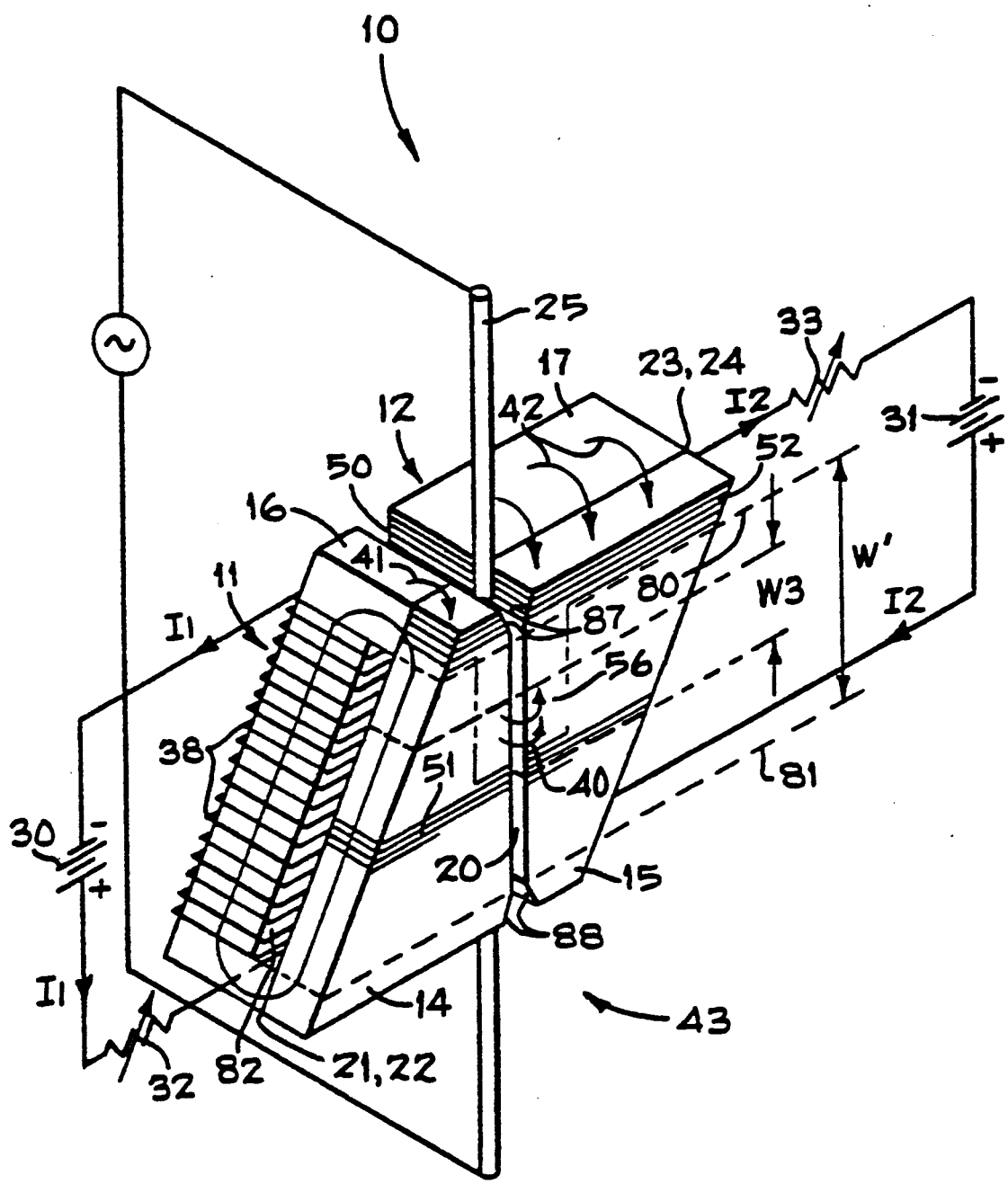
FIG_7

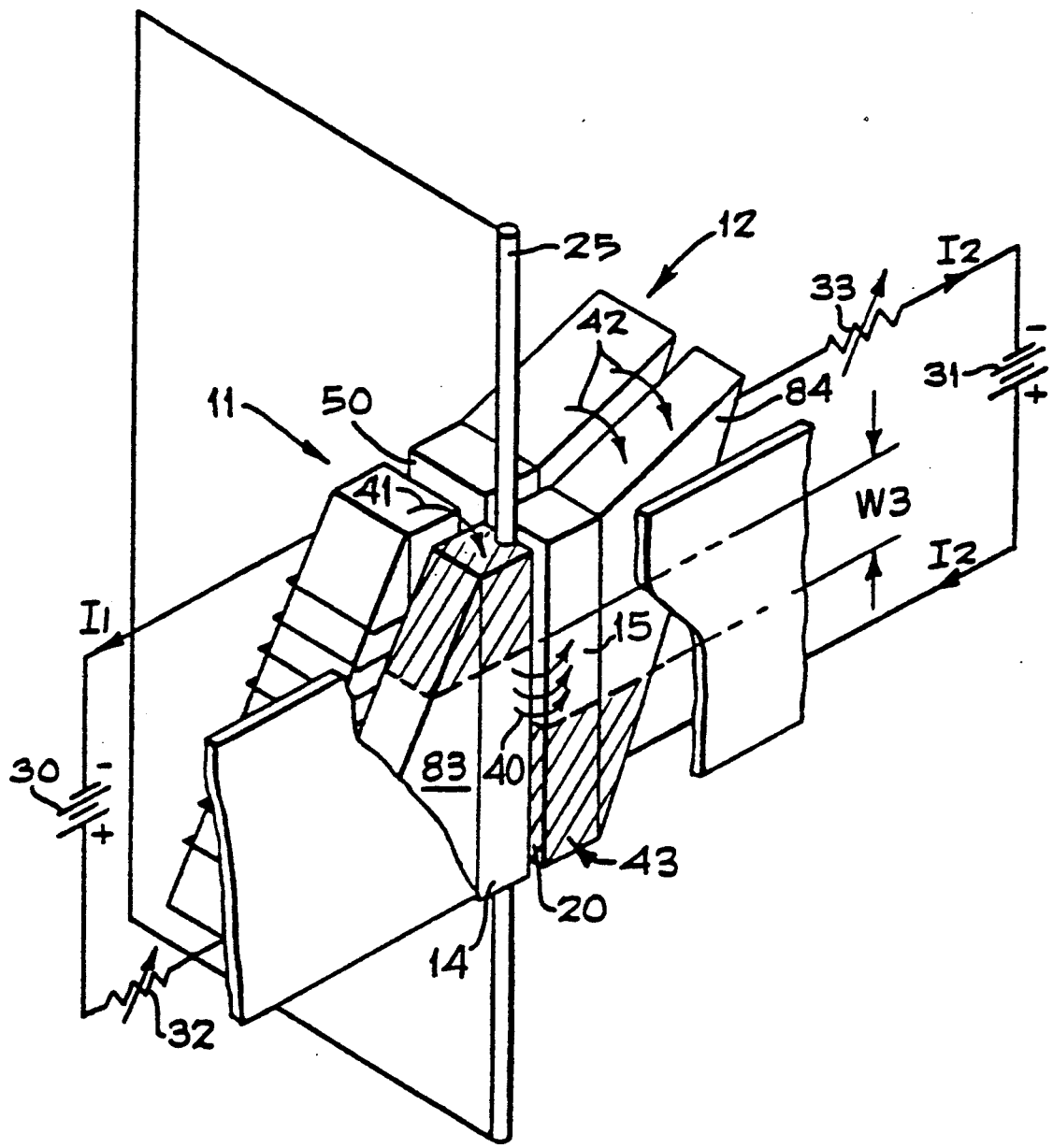
FIG_8

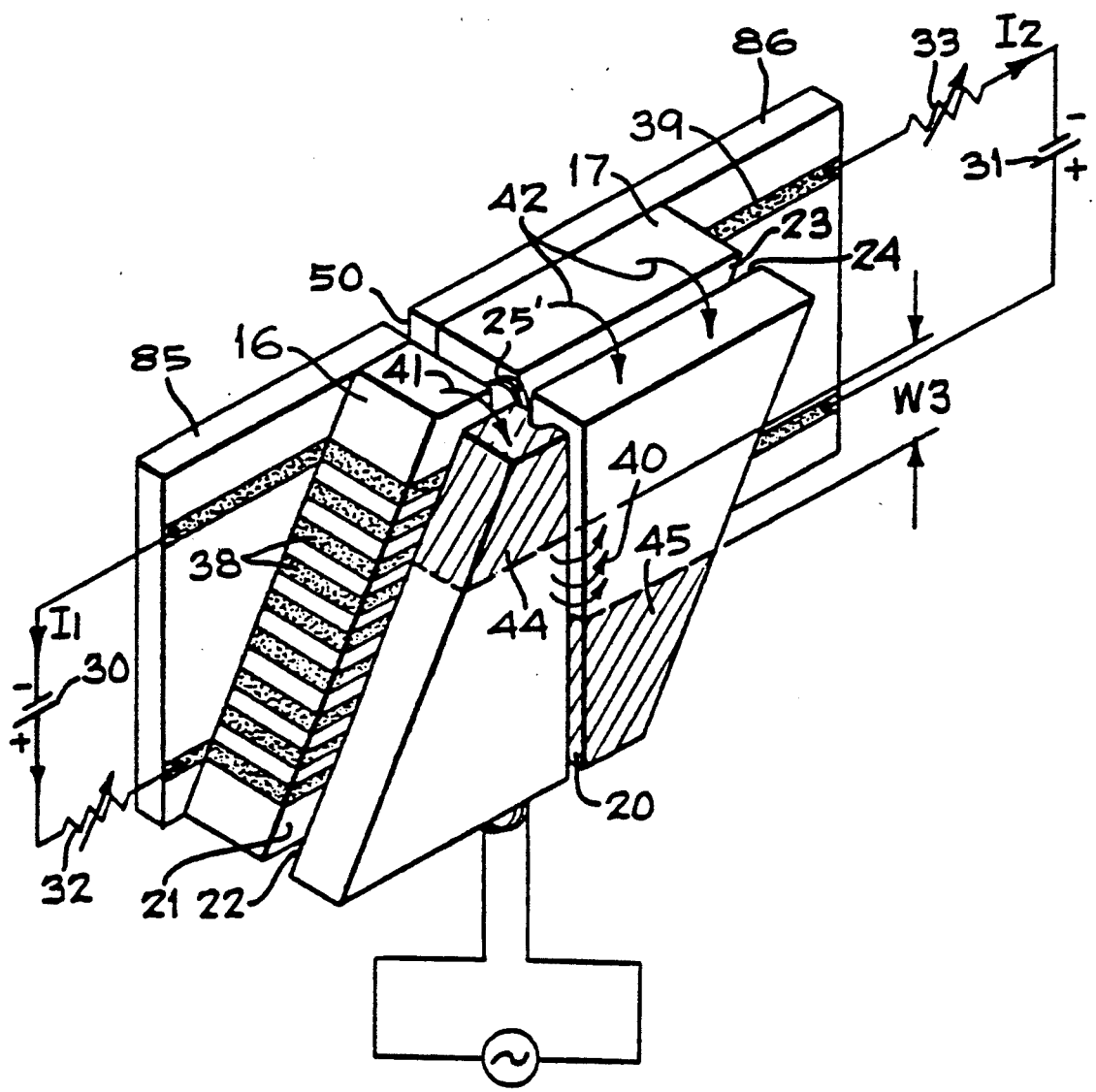
FIG_9

SCANNING TRANSDUCER HAVING TRANSVERSE INFORMATION AND CONTROL FLUX PATHS FOR REDUCED INTERFERENCE BETWEEN FLUXES

CROSS-REFERENCE TO RELATED APPLICATIONS

This is a continuation-in-part of my following co-pending U.S. patent applications: Ser. No. 06/715,211 filed Mar. 22, 1985 and entitled IMPROVEMENTS TO MAGNETICALLY CONTROLLED SCANNING HEADS, now abandoned; Ser. No. 06/829/592 filed Feb. 13, 1986 and entitled ELECTROMAGNETICALLY CONTROLLED SCANNING MAGNETIC TRANSDUCER; Ser. No. 06/843,453 filed Mar. 24, 1986 and entitled MAGNETICALLY CONTROLLED SCANNING MAGNETIC HEAD TRACKING CONTROL SYSTEM; U.S. national application Ser. No. 07/085,676 filed Aug. 6, 1987, which is based upon and entitled to the benefit of the effective filing date of Patent Cooperation Treaty patent application Ser. No. PCT/US86/02733 filed Dec. 15, 1986 and entitled METHOD AND APPARATUS FOR MAGNETIC TRANSDUCING; and U.S. national application Ser. No. 07/128,115 filed Aug. 6, 1987, now U.S. Pat. No. 4,985,795, which is based upon and entitled to the benefit of the effective filing date of Patent Cooperation Treaty patent application Ser. No. PCT/US86/02734 filed Dec. 15, 1986; U.S. patent application Ser. Nos. 06/715,211 and Ser. No. 06/829,592 are themselves continuations-in-part of U.S. patent application Ser. No. 06/641,817 filed Aug. 16, 1984, now abandoned. U.S. patent application Ser. No. 06/843,453 is a continuation-in-part of the following U.S. patent applications: Ser. No. 06/715,211; Ser. No. 06/829,592; Ser. No. 06/808,588 filed Dec. 13, 1985, now abandoned; and Ser. No. 06/808,924 filed Dec. 13, 1985, now abandoned. U.S. patent application Ser. No. 06/808,588 is a continuation-in-part of U.S. patent application Ser. No. 06/715,211. The U.S. national application Ser. No. 07,085,676 based upon Patent Cooperation Treaty patent application Ser. No. PCT/US86/02733 and the U.S. national application Ser. No. 07/128,115 based upon Patent Cooperation Treaty patent application Ser. No. PCT/US86/02734 are themselves continuations-in-part of the following U.S. patent applications: Ser. No. 06/715,211; Ser. No. 06/808,588; Ser. No. 06/808,924; Ser. No. 06/829,592; and Ser. No. 06/843,453.

Cross-reference is hereby made to U.S. patent application Ser. No. 06/808,921 filed Dec. 13, 1985 and entitled MAGNETIC RECORDING MEDIUM HAVING A MAGNETICALLY SATURABLE KEEPER LAYER AND MAGNETIC SIGNAL PROCESSING APPARATUS AND METHOD USING THE MEDIUM, abandoned in favor of the continuation-in-part U.S. National application Ser. No. 07/100,816 filed Aug. 6, 1987, which is based upon and entitled to the benefit of the effective filing date of Patent Cooperation Treaty patent application Ser. No. PCT/US86/02732 filed Dec. 15, 1986 and entitled MAGNETIC RECORD MEDIUM HAVING DISCRETE MAGNETIC STORAGE AND SATURABLE LAYERS AND MAGNETIC SIGNAL PROCESSING APPARATUS AND METHOD USING THE MEDIUM, which in turn was abandoned in favor of the continuation U.S. patent application Ser. No. 07/555,811 filed Jul. 23, 1990, now U.S. Pat. No. 5,041,922.

All of the above-identified patent applications and patents are assigned to Ampex Corporation, assignee of this patent application.

DISCLOSURE

This invention relates to a magnetic transducer wherein the location of a recording/reproducing zone within the transducer is controlled by magnetic rather than mechanical means. More particularly, this invention relates to an improved scanning transducer in which interference between a transducing signal flux and a control flux is reduced.

In wideband magnetic signal recording, great emphasis is placed on obtaining high relative transducer-to-record medium speed for the recording or playback of high frequency signals with high quality resolution. Increasing the speed of the record medium past a stationary transducer is limited by an increased medium consumption which would result, as well as by mechanical limitations associated with high speed of record medium transport.

Rotary head transducers utilized in magnetic tape recorders represent a significant development in increasing the relative head-to-tape speed. Here, the transducer rotates at high speed in contact with a relatively slowly advancing magnetic tape. There are two basic types of rotary scan recorders in common use, generally referred to as transverse and helical scan recorders, which differ on the angle at which the transducer sweeps the tape. There are many problems associated with obtaining a desired accuracy and reproducibility of the signal recorded by rotary scan recorders. For example, it is necessary to maintain very small mechanical tolerances of the rotating, transducer carrying drum, the transducer structure and the location of the transducer within the drum. At the same time, it is necessary to accurately maintain the rotational speed of the drum carrying the transducer with respect to the speed at which the tape is transported past the rotating transducer.

In magnetic recorders utilizing magnetically controlled scanning transducers, the disadvantages associated with mechanically rotating the transducers are eliminated. Here, the transducers are stationary and high scanning speed is obtained by magnetically scanning the signal to be transduced across the width of the transducer and thereby across the record medium.

One known electromagnetically controlled scanning magnetic transducer has stacked magnetic laminations separated from each other by nonmagnetic spacers. Each lamination provides a closed magnetic circuit having a gap defining a transducing zone. The stacked laminations have leg portions of controlled width gradually increasing in opposite directions on opposite sides of the transducer, which leg portions are linked by control windings. The scanning operation is obtained by saturating selected leg portions on opposite sides of the transducer so that only one lamination at a time remains unsaturated and capable of transmitting signal flux. The selection of this lamination is achieved by applying appropriate control currents to the control windings. A transducer having such a construction is described in U.S. Pat. No. 3,555,204.

In this type of known transducer, scanning is obtained by sequentially interrupting the magnetic circuit of each lamination, thereby interrupting the signal flux path. The controlled width leg portions, and resulting interruption zones, are at distant locations from the transducing zone. Consequently, the unsaturated lamination portions facing a record medium at the zone are susceptible to picking up crosstalk from active laminations or stray flux from adjacent recorded signal tracks on the medium. These picked-up signals may then be recorded on the medium or, at playback, may leak into the magnetic circuit of an adjacent active element and cause degradation of the playback signal. It will be appreciated that these disadvantages become more significant with increased frequency and density of recording.

It is a further significant disadvantage of this known transducer that, in order to reduce crosstalk between the laminations, each magnetic lamination of the stack is physically and magnetically separated from adjacent laminations. Therefore, only an incremental scanning motion across the medium is possible, and this is obtained by sequentially switching on/off the magnetic circuits of adjacent laminations, that is, in a discrete step-like manner, rather than continuously. Also, track widths must not be less than the width of a single lamination and is adjustable only to integral multiples of this width. This is a disadvantage particularly in high frequency wideband recording/reproduction on narrow tracks where continuous scanning and accurate positioning of the transducing element over a narrow track are required for high quality performance.

Embodiments of a magnetically controlled scanning magnetic transducer which overcomes these disadvantages are described in my above-identified patent application Ser. Nos. 06/641,817 and 06/829,592. The transducer embodiments described in these applications have magnetic control means which selectively saturates core portions adjacent to the physical transducing gap, facing the record medium. Each saturated core portion delineates an adjacent unsaturated portion, and the control means is arranged within each core portion so that a desired steep magnetic permeability versus flux density gradient is obtained at the transducer face. The unsaturated core portions on opposite sides of the physical gap overlap to define a transducing zone of a desired width extending across the gap.

One advantage of transducer embodiments described in the above identified applications over the previously known electromagnetically controlled scanning magnetic transducers is that a portion of the transducer face, that is, of a core portion facing the medium and adjacent to the gap, is saturated. Crosstalk and stray flux pick-up by the non-operating portions of the transducer core are thereby reduced to levels that do not degrade the quality of recorded or reproduced signals to an intolerable degree.

However, in the known transducers, and even in the above-indicated transducer design, the information signal flux paths and the control flux paths are substantially parallel within the transducer core. Thus, interference between these fluxes may occur when they are flowing along their respective paths in the same portion of the transducer core. Such interference can decrease the quality of signal recording and reproduction. In addition, control flux caused to fringe by the physical transducing gap in the direction of the signal flux will tend to demagnetize the record medium. While it is possible to arrange the geometry of the cores and the transducing and control windings thereon to minimize interference between the control and signal fluxes, the possibility of such interference cannot be eliminated entirely, particularly in small compact electromagnetically controlled scanning transducers.

It should be noted that the paths of active control flux and active information signal in the transducer described in U.S. Pat. No. 3,555,204 are generally in parallel planes. If there is control flux in an active lamination of such construction, such control flux and the information signal flux will necessarily conflict with one another at the location at which there is simultaneous flow of both control and signal information flux.

In accordance with the present invention, interference between the control and information signal fluxes of a magnetically controlled scanning magnetic transducer is reduced. In addition, the preferred embodiment of the present invention also maintains the above-described advantages of selectively saturating the transducer core portions facing the medium and adjacent to the physical transducing gap. The present invention also simplifies the structure of an electromagnetically controlled scanning transducer having the above-indicated features, to economize manufacture.

In keeping with the invention, the transducer is arranged so that the information signal flow path and the control flux path within the transducer body are generally transverse to one another. This transverse relationship significantly reduces interference/crosstalk caused by the presence of the two types of fluxes in the transducer core.

Most desirably, the transverse relationship of the flux paths is at the face portion of the transducer, i.e., a portion thereof which confronts a record medium. It is at this portion that segregation between the control flux and information signal flux is particularly important. Assuring that the planes containing the flux paths are transverse relative to one another, at all locations within the core at which there is apt to be simultaneous flow of information signal flux and control flux, is optimally provided.

It will be recognized that there are various ways to control the directions of the flux paths. Most simply, this can be done by controlling the orientation relative to the transducer of the mechanisms responsible for the flux. In the preferred embodiment, the control fluxes are generated by windings and the information signal flux is associated with an information signal winding. The desired transverse relationship of the flux paths within the transducer are achieved by appropriately orienting the control winding relative to the orientation of the information signal winding. Most desirably, the control flux and information signal flux paths are perpendicular to one another. The result is that interference/crosstalk is virtually eliminated.

At the same time, in the preferred embodiment the control windings are arranged to selectively saturate portions of core poles adjacent to the transducer physical transducing gap facing the record medium. These core portions include face portions which confront the path for the record medium. Each saturated face portion defines an adjacent unsaturated face portion, while a desired steep permeability versus flux density gradient is obtained across the transducer width. The unsaturated face portions located on opposite sides of the physical transducing gap overlap across the gap to define a highly permeable transducing zone of a desired width.

The preferred embodiments of the magnetically controlled scanning transducer described in this application are electromagnetic and have two confronting magnetic front core poles or segments defining a physical gap therebetween and two confronting magnetic back core portions corresponding to, and in close proximity to, the front core poles. An information signal winding is arranged in the front core poles immediately at the gap. Respective control windings are arranged in each back core portion for providing control fluxes therein which are magnetically coupled into the associated front core poles. The information signal winding and the control windings are arranged perpendicularly to one another. More specifically, the respective turns of the information signal and control windings extend in substantially perpendicular planes to each other. By selectively applying a control current to each control winding, a control flux is induced in each back core portion and is coupled from each back core into the corresponding front core pole. The thusly induced control fluxes selectively saturate the front core poles on both sides of the physical transducing gap. The saturated portions of each pole define adjacent unsaturated highly permeable portions. These permeable portions overlap across the physical transducing gap to define a transducing zone.

In accordance with a preferred embodiment of the present invention, a desired steep flux density versus permeability gradient across the transducer width is obtained by providing the corresponding front core poles in the form of two oppositely oriented confronting wedge sections. The wedge sections have cross-sectional areas gradually increasing in opposite directions on either side of the physical transducing gap along the width thereof. Respective control currents are applied to control windings arranged at the back core portions. The resulting magnetic flux from each back core portion is coupled to the adjacent front core pole. The magnitudes of the control currents are selected to saturate a portion of each front core while leaving an adjacent unsaturated highly permeable portion of each front core. These unsaturated highly permeable portions overlap to define a transducing zone of a desired width extending across the physical transducing gap. By changing the magnitudes of the respective control currents in opposite sense, the position of the transducing zone can be changed along the width of the transducer. For example, when the magnitudes of the respective control currents are continuously varied in opposite sense, the location of the highly permeable transducing zone is continuously scanned along the width of the transducer. Alternatively, the control currents can be changed so that the transducing zone is narrowed, widened or otherwise modified in a continuous manner.

It should be noted that because of the wedge configuration of the front core poles the path in the transducer of the control flux will not be exactly perpendicular to the path of the information signal flux. This affect is not major, however, and can be ignored as a practical matter.

BRIEF DESCRIPTION OF THE DRAWINGS

FIG. 1A is a simplified perspective view of a preferred embodiment of a magnetically controlled scanning magnetic transducer in accordance with the invention.

FIGS. 1B to 1D respectively illustrate examples of recording formats which can be obtained when utilizing the transducer of the present invention.

FIG. 2 is a schematic diagram of a control circuit utilized to drive the transducer of FIG. 1A.

FIG. 3 is a control voltage versus control current characteristic obtainable from the circuit of FIG. 2.

FIG. 4 is an example of a flux density versus permeability characteristic of a well known magnetic material.

FIG. 5 shows a front elevation view of two confronting front core poles of the transducer of FIG. 1A rotated by 90 degrees.

FIG. 6 shows two superposed flux density versus permeability characteristics of FIG. 4, each corresponding to one front core pole shown in FIG. 5.

FIG. 7 is a perspective view of another embodiment of the magnetically controlled scanning transducer of the invention.

FIG. 8 is a perspective view of yet another embodiment of the transducer of the invention.

FIG. 9 is a a perspective view of still a further embodiment of a magnetically controlled scanning magnetic transducer in accordance with the present invention.

DETAILED DESCRIPTION

In the following description and drawings, like elements will be designated by like reference numerals to facilitate comparison between various embodiments. The description of similar elements and circuit portions illustrated in more than one figure of the drawings may not be repeated with reference to each of the figures.

FIG. 1A shows a preferred embodiment of an electromagnetically controlled scanning transducer of the invention. The transducer 10 has two confronting cores 11, 12 made of a magnetic material. Each core 11, 12 has a front core portion 14, 15 and a back core portion 16, 17 arranged in close proximity to one another, with respective lateral surfaces 22, 24 and 21, 23 of the front and back cores in confronting relationship.

The confronting front core poles 14, 15 are smoothly lapped and polished at a physical gap 20 to obtain confronting magnetic pole faces 18, 19. A winding window 26 is provided in a well known manner in one or both front core poles 14, 15 across the width W of transducer 10 to accommodate an information transducing signal winding 25. Winding 25 is shown in FIG. 1A as an example, as a single turn winding in the form of a conductive rod. However, a conventional multiturn winding may be utilized instead, such as shown at 25' in FIG. 9.

A suitable nonmagnetic material is provided between the pole faces 18, 19 to obtain a physical transducing gap 20, utilizing conventional gap forming techniques. For example, a layer of silicon dioxide or glass may be deposited on the confronting faces 18, 19, which faces then may be bonded together in a well known manner.

In the preferred embodiment being described, the front core poles 14, 15 are made in the form of oppositely oriented wedge sections, confronting at physical transducing gap 20. The oppositely oriented wedge sections of each confronting core 11, 12 have cross sectional areas gradually increasing in opposite directions across the width W of the transducer 10.

Back core portions 16, 17 are also formed as oppositely oriented wedge sections corresponding to those of the front cores 14, 15. Alternatively, the back cores may be of a rectangular or other shape suitable to provide a control flux for selectively saturating the front core poles 14, 15.

Respective control windings 38, 39 are wound around each back core portion 16, 17 transverse to the direction in which the information signal winding 25 extends through the gap 20. By the foregoing arrangement of the signal and control windings, a respective signal flux 40 and control fluxes 41, 42 are induced in the transducer cores, which fluxes extend generally in transverse paths with respect to one another.

The foregoing winding orientation is an important feature of the present invention. It significantly reduces the presence of control flux components in the signal flux path, as well as of signal flux components in the control flux path, as previously mentioned. Interference and/or crosstalk between the control and signal fluxes is correspondingly reduced. As illustrated, the windings are so arranged that such fluxes are generally perpendicular to one another. Such perpendicular relationship virtually eliminates interference and/or crosstalk.

To obtain desired efficient coupling of the control fluxes generated by the control windings 38, 39, from the back core portions 16, 17 into the front core poles 14, 15, it is important to arrange the respective confronting lateral surfaces 21, 22, and 23, 24, as close as possible. Ideally, these surfaces should abut to lower the reluctance of the control flux paths between the back and front cores.

It is preferred to provide each of the back core portions 16, 17 with somewhat of a larger area than the associated front core portions 14, 15 in the cross sectional directions perpendicular to that of the control flux paths extending therein. The foregoing assures that the back core portions will not be saturated by the control fluxes before the front core portions are saturated.

Alternatively, or in addition to the foregoing feature, to avoid saturation of the back cores a material for the back core portions may be selected having a greater saturation density than the material of the front core portions.

In operation, respective control currents $I_1$, $I_2$ are applied to the control windings 38, 39. As well known from the theory of electromagnetism, a magnetic flux is thereby induced in each back core portion 16, 17 in a direction perpendicular to the direction of the control current flow, as shown by control flux lines 41, 42. The control flux from the back core portions 16, 17 is coupled into the closely spaced front core portions 14, 15, respectively. The control currents $I_1$, $I_2$ are applied, for example, from respective D.C. control voltage sources 30, 31 via variable resistors 32, 33, to flow through respective control windings 38, 39 as shown in FIG. 1A. The magnitudes of the control currents are selected such that selected portions 44, 45 of each front core 14, 15 are saturated thereby. The respective saturated portions 44, 45 are designated by cross-hatched areas in FIG. 1A. The saturated portions define adjacent unsaturated highly permeable portions which overlap at the gap to define a transducing zone 56. It is preferable to orient the control currents $I_1$, $I_2$ such that both control fluxes 41, 42 extend in the same sense, as shown in FIG. 1A. Possible interference between these control fluxes across the transducing gap 20 is thereby eliminated.

To obtain selected saturated portions of each front core pole 14, 15, as previously indicated a control circuit, such as shown in FIG. 2, as will be described below, is utilized to supply respective control currents $I_1$, $I_2$ to control windings 38, 39.

In the example shown in FIG. 1A, the magnitude of control current $I_1$ is selected such that a resulting control flux 41 induced from the back core portion 16 into the front core portion 14, saturates a portion 44 thereof having a width W1. Further, the magnitude of control current $I_2$ is selected to induce a control flux 42 into front core portions 15 from back core portion 17 which saturates a portion 45 of front core pole 15, having a width W2.

As seen from FIG. 1A, the saturated core portions 44, 45 include parts of the transducer face 43 facing the record medium on opposite sides of the transducing gap 20 and immediately adjacent thereto. The saturated portions 44, 45 define respective adjacent highly permeable unsaturated portions or regions 46, 47 which overlap (are adjacent) one another at the gap 20. The overlapping portions 46, 47 define a highly permeable transducing zone 56 of a width W3 extending across the gap 20. It is seen from FIG. 1A that the total gap width W of the entire transducing gap, W1+W2+W3, equals a constant.

By increasing the magnitude of one control current, for example $I_1$, while correspondingly decreasing the magnitude of the other control current, for example $I_2$, the respective widths W1, W2, change in opposite senses, and the transducing zone 56 is selectively moved along the width W of the physical transducing gap 20. For example, when it is desired to periodically scan the transducing zone 56 at a high speed along the transducer width W, a control circuit can be utilized which periodically changes the magnitude of both currents $I_1$, $I_2$ in opposite directions, thereby changing the widths W1, W2 of the saturated portions 44, 45 in opposite senses. To maintain a constant width W3 of the transducing zone 56 during scanning, it is necessary to maintain a constant sum of the changing control currents, that is $I_1 + I_2$ equals a constant.

In the preferred embodiment the control currents $I_1$, $I_2$ are varied differentially to periodically scan a transducing zone of a constant width across the width W of the transducer. An information signal may thereby be recorded or reproduced along transverse track 35 of a longitudinally moving magnetic tape 36 in a direction 27, as shown in FIG. 1B.

It will be understood that recording/reproducing applications other than that described above, easily can be obtained. For example, when current values $I_1$, $I_2$ are maintained constant, for example by utilizing D.C. sources 30, 31 shown in FIG. 1A and setting the variable resistors 32, 33 at a constant value or values, the transducing zone will assume a fixed position. This latter application may be useful to obtain recording along longitudinal tracks such as shown at 37 in FIG. 1D. During recording/reproduction on longitudinal or helical tracks, the position of the transducing zone may be stepped from track to track by suitable control of the magnitudes of the control currents. In other applications, recorded helical tracks 34, as shown in FIG. 1C, may be recorded or reproduced by fixedly mounting the transducer of the invention to a rotting drum member, such as a rotating tape guide, while the position of the transducing zone is moved relative to the width of the tape.

FIG. 2 is a schematic diagram of a control circuit 54, which may serve as sources 30, 31 of the embodiment illustrated in FIG. 1A that drive the control windings 38, 39 of transducer 10 to control the position of a transducing zone 56 at the transducer face 43 along the width W of the transducer. In the presently described embodiment, the transducing zone 56 is periodically scanned along transverse tracks 35 of magnetic tape 36, as shown in FIG. 1B. It will be understood, however, that control circuit 54 may be adapted to obtain different operating modes for transducer 10 when utilized in other recording/reproducing applications as previously mentioned.

The circuit 54 of FIG. 2 utilizes an A.C. control voltage source 61 generating a periodically changing control voltage Vc. Voltage Vc is converted by the circuit of FIG. 2 into differentially changing control currents $I_1$, $I_2$. The voltage Vc is applied via a resistor 62 to an inverting input of a first operational amplifier 63. Amplifier 63 has a feedback resistor 64, and represents a voltage follower. The output of amplifier 63 is connected via a further resistor 65 to an inverting input of a second operational amplifier 66 which has a feedback resistor 67. The amplifier 66 inverts the output signal of amplifier 63.

The output of first amplifier 63 is also connected via a resistor 68 to an inverting input of a third operational amplifier 69 having a feedback resistor 70. The output of second amplifier 66 is connected via a resistor 71 to an inverting input of a fourth amplifier 72 having a feedback resistor 73. An adjustable potentiometer 74 is connected between a source of negative DC voltage and ground to obtain a control current offset Io.

The output of potentiometer 74 is connected via a resistor 75 to the inverting input of third amplifier 69 and via a resistor 76 to the inverting input of fourth amplifier 72, respectively. The output of the third amplifier 69 is connected to the previously described first control winding 38 of transducer 10, which in turn is connected via feedback resistor 70 to the inverting input of such amplifier 69. Similarly, the output of the fourth amplifier 72 is connected to the previously described second control winding 39, whose second terminal is connected via feedback resistor 73 to the inverting input of amplifier 72.

The connection between winding 38 and resistor 70 is grounded via a resistor 77. Similarly, the connection between coil 39 and resistor 73 is grounded via a resistor 78. The respective non-inverting inputs of all four operational amplifiers 63, 66, 69 and 72 are grounded. The amplifiers 69, 72 and respective resistors 70, 77 and 73, 78 represent a first and second current source, respectively.

In operation, the voltage Vc from source 61 is applied via voltage follower 63, 64, to a first current source 69, 70, 77 which applies a control current $I_1$, directly proportional to input voltage Vc to the first control winding 38. The voltage at the output of amplifier 63 inverted by the inverter 66, 67 is further applied to the second current source 72, 73, 78, which applies a control current $I_2$ inversely proportional to the input voltage Vc to the second control winding 39. The potentiometer 74 sets a desired control current offset Io. In the presently described embodiment, Io is half way between the minimum and maximum control current values, that is Io=(Imax-Imin)/2, as will be described below in more detail with reference to FIG. 3.

When voltage Vc has a periodically changing amplitude between Vcmin and Vcmax as shown in the diagram of FIG. 3, circuit 54 converts the thusly changing control voltage into substantially linearly changing control currents $I_1$, $I_2$. The control currents $I_1$, $I_2$, change differentially, that is in opposite sense with respect to each other, while changing substantially in linear proportion to the input voltage Vc as depicted in FIG. 3 and defined by the following equations:

$$I_1 = KVc + Io$$

$$I_2 = KVc + Io$$

where K and Io are constants dependent on the parameters of the circuit of FIG. 2 determined empirically for the transducer and desired operation.

A well defined boundary between adjacent saturated and unsaturated areas of the front cores 14, 15 is desirable to obtain high quality performance. This can be obtained by selecting the shape of the confronting front core segments in the preferred arrangement such that a maximum rate of change in permeability between adjacent cross-sectional areas of each core segment is obtained across the transducer width W. The foregoing assures that while a selected area of each front core is saturated by a control current so that no appreciable flux passes therethrough, an immediately adjacent contiguous area remains sufficiently permeable as is desired for the passage of information signal flux. Consequently, the performance of the transducer 10 depends on the steepness of the permeability versus flux density gradient between adjacent saturated and nonsaturated regions within each front core portion or pole.

While in this embodiment the shapes have been selected to provide the desired changes in permeability, it will be recognized by those skilled in the art that other parameters, such as magnetic material selections, can be varied to achieve such changes.

FIG. 4 shows a well known permeability m versus flux density B characteristic of a suitable magnetic core material, ferrite PS52B, made by Ampex Corporation. As seen from FIG. 4, a relatively high permeability m, greater than 400, is obtained at a flux density B below B1=4000 Gauss, which high permeability is sufficient for a desired satisfactory flow of information signal flux. The saturation flux density of ferrite PS52B is approximately B2=6000 Gauss, corresponding to a permeability below 100, as shown in FIG. 4. Consequently, for obtaining a desired rapid transition between a highly permeable region and an adjacent saturated region within the transducer front core portions, the permeability changes rapidly from below 100 to over 400 in either direction, shown by FIG. 4.

FIG. 6 shows an example of two superposed flux density versus permeability characteristics 53, 53a, each corresponding to the characteristic of FIG. 4 and each pertaining to one oppositely oriented wedge shaped front core portion or segment 14, 15. FIG. 5 is a schematic front view representation of the confronting front core segments 14, 15 of FIG. 1A rotated y 90 degrees. The cross-hatched areas 44, 45 represent the saturated regions, that is, core portions having a permeability less than 100. The other core portions in FIG. 5 represent unsaturated highly permeable areas 46, 47 having a permeability over 400. The transducing zone 56, which extends across the gap 20 and which is formed by the overlapping unsaturated highly permeable regions 46, 47, corresponds to the overlapping portions of superposed characteristics 53, 53a, which each have a permeability greater than 100.

It is seen from FIGS. 5 and 6 that for a well defined transducing zone 56 a characteristic having a permeability versus flux density gradient as sharp as possible is desirable. This can be obtained by selecting a transducer core material with a steep characteristic curve and by designing the wedge sections such that large flux density changes can take place between adjacent cross-sectional areas over the entire transducer width W, which defines the possible scanning length. To further increase the permeability gradient, a transducer core material is preferably used having a magnetic anisotropy and oriented with its easy axis of magnetization perpendicular to the gap plane.

The flux density gradient between adjacent cross-sectional areas also can be increased to obtain a desired maximum permeability versus flux density gradient by forming the wedge sections to have cross sectional areas at the front cores 14, 15 that exponentially increase in the direction of the transducer width W. The foregoing can be obtained by providing exponentially increasing side surfaces 48, 49 of front core segments 14, 15, as shown in phantom in FIG. 5. To further enhance a desired sharp definition of the unsaturated, highly permeable zone, the front core segments 14, 15 may be made of thin magnetic laminations insulated from each other by a thin nonmagnetic layer. These lamination layers, for example shown at 51 and 52 in FIG. 7, are preferably provided in a direction perpendicular to the transducing gap plane and stacked along the transducer width W utilizing well known magnetic core lamination techniques.

It is understood from the foregoing description of the operation of the transducer of FIG. 1A that the control flux 41 or 42 generated in either one of the back core portions 16 or 17 should not be coupled into the other back core portion. Therefore, it is preferable to provide between these back core portions 16, 17, a gap 50 of a substantially greater length L with resect to a length 1 of the transducing gap 20 provided between the front cores 14, 15. Preferably, the ratio 1:L is selected to be 1:10 or more.

To keep transducing signal flux losses at a minimum, it is preferable to provide the winding window 26 closer to the transducer face 43 than to the lateral surfaces 22, 24 opposite such face 43. A preferable ratio of these respective distances of the winding window from surfaces 43 and 22, 24 is approximately 1:10.

Another embodiment of the present invention is shown in FIG. 7. This embodiment is similar to that illustrated in FIG. 1A and, therefore, only differences between the embodiments will be described with reference to FIG. 7. In the embodiment of FIG. 7, respective grooves 82 are provided in the back cores 16, 17, inwardly of the lateral surfaces 21, 23. Grooves 82 serve to accommodate the control windings 38, 39, of each of the back core portions 16, 17, respectively. In the embodiment of FIG. 7, the control winding and the groove of only back core portion 16 is illustrated in the drawing, although it will be understood that the constructions of both back core 16 and back core 17 are similar.

It is seen that by placing the control windings 38, 39 in recesses provided by grooves 82, the confronting lateral surfaces 21, 22 and 23, 24 can be placed in intimate contact with each other. Air gaps between the front and back cores are thereby substantially eliminated, while a desired tight magnetic coupling between these cores is obtained. However, in the embodiment of FIG. 7 the uppermost and lowermost portions of the face 43 across the transducer width will not become saturated because of the intimate contact between the front and back core portions at these locations. Consequently, only an area between the interrupted lines 80, 81 will become saturated.

To eliminate crosstalk between the unsaturated areas of the corresponding front core segments 14, 15, bevelled edges 87, 88 are preferably provided at both ends of the gap 20 across the transducer width W. A reduced effective transducer depth dimension extending away from the face 43 towards the back cores 16, 17 W' thus extends between the lines 80, 81.

Another embodiment of the present invention is shown in FIG. 8. It differs from that of FIG. 1A in that portions 83, 84 of the front cores 14, 15 are provided which diverge away at a selected angle from the front surface 43 of the transducer. Preferably the angle of divergence is about 15 degrees. This minimizes the transducer-to-medium interface area, thereby reducing wear in contact recording and reproducing applications. It also reduces head contour effect, thereby minimizing any interference between the flux at the gap and flux originating from outer edges of the transducer.

Another embodiment of the present invention is depicted in FIG. 9. Here, the control windings 38, 39 are deposited on the back core portions 16, 17 in the form of a thin film layer. For example a layer of copper is deposited utilizing a suitable mask and well known material deposition techniques. In this embodiment the gap between the respective confronting lateral surfaces 21, 22 and 23, 24 of the front and back cores is minimized. The embodiment of FIG. 9 has an average over the embodiment of FIG. 7 in that a minimum reluctance between the front and back cores is obtained without the need of providing grooves in the back cores to accomodate the control windings. The thin film coils 38, 39 in FIG. 9 are terminated on respective insulating terminal boards 85, 86 to facilitate connection with the respective voltage source 30, 31.

It is noted that the representation of the respective gaps between the confronting surfaces 21, 22 and 23, 24, as well as the representations of gaps 20 an 50 is greatly exaggerated in size in all FIGURES.

While the transducer-to-medium interface has been shown in the various embodiments as being generally flat it may be contoured, if desired, utilizing well known contouring techniques.

It is preferable to hold the resulting transducer structure in a nonmagnetic holder (not shown) and to bond the respective transducer elements together by, for example, epoxy utilizing well known bonding techniques. However, such bonding material is deleted from the respective drawing figures to obtain better clarity of representation.

It is seen that in all the above described transducer embodiments the respective control fluxes 41, 42 extend substantially in perpendicular paths to the direction of the transducing signal flux 40, resulting in substantial elimination of any interference between these fluxes. In addition, it is seen from the foregoing disclosure that these preferred embodiments are relatively simple to manufacture, while desired core shapes may be obtained to maximize the permeability versus flux density gradient across the transducer width.

While the invention has been shown and described with particular reference to various embodiments thereof, it will be understood that variations and modifications in form and details may be made therein without departing from the spirit and scope of the invention as defined in the appended claims.

What is claimed:

1. A magnetic transducer comprising:

magnetic core means having a face portion defining a transducing zone providing a path for information signal flux, for magnetically coupling information signal flux relative to a record medium located adjacent to said face portion;

information signal means associated with said core means for coupling information signal flux that flows in said path in said core means; and means for providing control flux to selectively saturate a portion of said face portion of said core means to direct the flow of information signal flux in said face portion, said control flux providing means being disposed to cause said control flux to flow in said face portion in a direction generally transverse to said path of information signal flux in said face portion.

2. The magnetic transducer of claim 1 wherein said control flux providing means is disposed relative to said magnetic core means to cause said control flux to flow within said face portion in a direction which substantially perpendicular to said path of said information signal flux.

3. The magnetic transducer of claim 1 wherein said control flux providing means includes electromagnetic means for generating said control flux in said magnetic core means.

4. The magnetic transducer of claim 3 wherein each of said control flux providing means and said information signal means includes an electrical winding for transferring signals with respect to said magnetic core means, said windings being disposed with their respective turns extending in planes generally transverse to each other.

5. The magnetic transducer of claim 4 wherein said windings of said control flux providing means and of said information signal means have their respective turns extending in planes which are substantially perpendicular to each other.

6. The magnetic transducer of claim 1 wherein said control flux providing means is disposed to provide control flux in said face portion which extends in a direction generally transverse to a plane containing the path of information signal flux in said face portion.

7. The magnetic transducer of claim 1 wherein said magnetic core means includes a pair of magnetic core segments defining a physical gap therebetween at said transducing zone, and said control flux providing means includes a pair of control windings, each of which is respectively associated with a corresponding one of said magnetic core segments for generating control flux in said associated one of the magnetic core segments.

8. The magnetic transducer of claim 7 wherein said transducing zone is defined partially by a physical gap having a width extending in a direction transverse to a plane containing the path of information signal flux, each of said control windings is provided along said width, and said control flux providing means includes current supply means for applying a control current to each of said control windings for selectively saturating portions of said face portions of said magnetic core segments.

9. The magnetic transducer of claim 8 wherein said current supply means are coupled to apply control currents of constant magnitudes to said control windings to maintain a predetermined location and constant width of said transducing zone within said magnetic core means.

10. The magnetic transducer of claim 8 wherein said control supply means are coupled to apply control currents of varying magnitudes to said control windings to thereby correspondingly vary respective widths of the saturated face portions.

11. The magnetic transducer of claim 10 wherein said current supply means are coupled to vary the magnitudes of said control currents linearly and in opposite sense with respect to each other while maintaining a constant sum of said control currents, to vary the location of said transducing zone within said magnetic core means while maintaining a constant width thereof.

12. The magnetic transducer of claim 10 wherein said current supply means are coupled to periodically vary the magnitudes of said control currents to obtain periodical varying of the location of said transducing zone within said magnetic core means in the direction of said width.

13. The magnetic transducer of claim 10 wherein said current supply means includes means for varying the sum of said control current magnitudes to modify the width of said transducing zone within said magnetic core means in the direction of said physical gap width.

14. The magnetic transducer of claim 1 wherein said control flux providing means effects saturation in said portion of said magnetic core means by providing a permeability generally equal to or less than 100 in said portion.

15. The magnetic transducer of claim 1 wherein said magnetic core means are provided in the form of two oppositely oriented wedge sections, each wedge section having a cross-sectional area that gradually increases in a direction along said transducing zone with the direction of area increase in one wedge section on one side of said transducing zone being opposite that in the other wedge section on the other side of said transducing zone.

16. The magnetic transducer of claim 1 wherein said magnetic core means comprises two confronting magnetic cores, each having a front core and a back core in proximity to each other, said front cores defining said face portion and having a transducing gap therebetween at which said transducing zone is defined, a transducing signal winding disposed in magnetic flux coupling relation to said front cores, and a separate control winding disposed in magnetic flux coupling relation to each said back core for providing a control flux coupled to selectively saturate said portion of the face portion of said associated front core adjacent said transducing gap.

17. The magnetic transducer of claim 16 wherein said separate control windings in both said back cores are coupled to provide said control flux oriented in the same direction.

18. The magnetic transducer of claim 16 wherein each of said front cores provides a gradually increasing reluctance in a direction along said transducing gap with the direction of reluctance increase in one front core opposite that in the other front core.

19. The magnetic transducer of claim 16 wherein said transducing signal winding and said control windings are disposed in substantially perpendicular planes to each other.

20. The magnetic transducer of claim 16 wherein said front cores are provided in the form of oppositely oriented wedge sections, each wedge section having a cross-sectional area that gradually increases in a direction along said transducing gap with the direction of area increase in one wedge section on one side of said transducing gap being opposite that in the other wedge section on the other side of said transducing gap.

21. The magnetic transducer of claim 20 wherein each of said back cores has the form of a wedge section similarly oriented as the front core associated therewith.

22. The magnetic transducer of claim 18 wherein each of said front cores comprises a plurality of stacked magnetic laminations magnetically insulated from each other, and each lamination has planar surfaces extending substantially perpendicularly to said transducing gap.

23. The magnetic transducer of claim 16 wherein said back cores have larger cross-sectional areas in planes perpendicular to said control flux than corresponding cross sectional areas of said front cores, to prevent saturation of said back cores by said control flux.

24. The magnetic transducer of claim 16 wherein said back cores and said front cores are made of a magnetic material, and the material of said back cores has a higher saturation density than that of said front cores.

25. The magnetic transducer of claim 16 wherein at least one of said front cores has an transducing signal winding window provided therein extending substantially in parallel with said transducing gap.

26. The magnetic transducer of claim 16 wherein each of said back cores has a recess provided therein extending inwardly of a lateral surface confronting an associated front core for accommodating a control winding.

27. The magnetic transducer of claim 16 wherein said control windings are provided in the form of a thin film deposited on said back cores.

28. The magnetic transducer of claim 16 wherein each of said front cores has a first portion defining a front face adjacent to said transducing gap and extending in a direction substantially parallel to a surface of a record medium when positioned to record and/or reproduce information signals with respect to said record medium, and a second portion contiguous with said first portion and defining a facing surface that extends in a direction that diverges away from the direction of extent of said front face.

29. A magnetic transducer comprising:
magnetic core means providing a path for information flux, including a nonmagnetic gap extending in a width direction for effecting coupling of information signal flux relative to a record medium;
information signal means magnetically coupled to said core means for transferring information that is defined in said core means as information signal flux which flows along said path in said core means, which path lies in a plane transverse to said width direction of said gap; and
means for providing control flux which flows in said core means adjacent to said gap to define a transducing zone that determines the location at which information signal flux is coupled for recording and/or reproducing information relative to a record medium;
said control flux providing means being disposed to provide control flux which flows along a path in a plane which is generally transverse to the plane containing the path of information signal flux such that the path of information signal flux is transverse to the path of control flux in the vicinity of said transducing zone.

30. The magnetic transducer of claim 29 wherein said control flux providing means is disposed to provide control flux in the vicinity of said transducing zone which is substantially perpendicular to the plane containing said path of said information signal flux.

31. The magnetic transducer of claim 29 wherein each of said control flux providing means and said information signal means includes an electrical winding, said windings being disposed with their respective turns extending in planes generally transverse to each other.

32. The magnetic transducer of claim 31 wherein said windings of said control flux providing means and of said information signal means have their respective turns extending in planes which are substantially perpendicular to each other.

33. The magnetic transducer of claim 31 wherein said transducing zone is defined partially by a physical gap having a width extending in a direction transverse to a plane containing the path of information signal flux, said windings of said control flux providing means are provided along said width, and said control flux providing means includes control supply means for applying control current to said windings.

34. The magnetic transducer of claim 29 wherein said control flux providing means effects saturation in a portion of said magnetic core means by providing a permeability generally equal to or less than 100 in said portion.

35. The magnetic transducer of claim 29 wherein said magnetic core means are provided in the form of two oppositely oriented wedge sections defining said nonmagnetic gap therebetween, each wedge section having a cross-sectional area that gradually increases in a direction of said width with the direction of area increase in one wedge section on one side of said transducing zone being opposite that in the other wedge section on the other side of said transducing zone.

36. A magnetic transducer comprising:
a magnetic core having two confronting poles defining a physical transducing gap therebetween at a face of said magnetic core, each of said poles having a gradually increasing magnetic reluctance in a direction along the extent of said gap with the reluctance increase of one pole on one side of said gap in a direction opposite that of the other pole on the other side of said gap;
two control windings, each of which is disposed in magnetic coupling relation with a corresponding one of said poles, for providing a control flux selectively saturating each of said poles at the face of said magnetic core; and
an information signal winding disposed in magnetic coupling relation with said magnetic core for linking an information signal flux, said information signal flux and said control flux extending through said core in generally transverse paths relative to each other at said face of said magnetic core.

37. The magnetic transducer of claim 36 wherein said confronting poles are provided in the form of oppositely oriented wedge sections, each wedge section having a cross-sectional area that gradually increases in the direction along the extent of said gap to provide said gradually increasing magnetic reluctance, the direction of area increase in one wedge section being in one of said opposite directions and that of the other wedge section being in the other of said opposite directions.

38. An electromagnetically controlled magnetic transducer comprising:

two corresponding magnetic cores with poles confronting one another at a plane to define a physical transducing gap therebetween at face portions defined by said magnetic cores that are transverse to said plane;

two control windings, each of which is disposed in magnetic coupling relation with a corresponding one of said poles, for providing a control flux selectively saturating said face portion of each of said poles;

each of said saturated face portions defining an adjacent, unsaturated highly permeable face portion, at least a part of said highly permeable face portion of one pole being adjacent a corresponding part of said highly permeable face portion of the other pole in a direction across the physical transducing gap to define a transducing zone; and an information signal winding disposed in magnetic coupling relation with said magnetic cores for transferring information signal flux relative to a record medium located adjacent said face portions, said signal flux and said control flux extending within said face portions of said cores in paths which are generally transverse to each other.

39. The transducer of claim 38 wherein said signal flux and control flux paths are generally perpendicular to one another.

40. An electromagnetically controlled scanning magnetic transducer comprising:

two corresponding magnetic front core segments defining a physical transducing gap therebetween at a face thereof;

two corresponding magnetic back core portions, each of which is in proximity to and magnetically coupled with a corresponding one of said front core segment;

an information signal winding magnetically coupled with each of said front core segments for transferring information signal flux with respect to said front core segments; and a control winding magnetically coupled with each of said back core portions for providing a control flux selectively saturating the associated one of said front core segments at its face, said information signal flux and said control flux extending within said front core segments in flux paths which are generally transverse to each other.

41. The transducer of claim 40 wherein said signal flux and control flux paths are generally perpendicular to one another.

42. An electromagnetically controlled scanning magnetic transducer comprising:

two corresponding magnetic front core segments defining a physical transducing gap therebetween at face portions of said segments, said front core segments having the form of oppositely oriented wedge sections, each wedge section having a cross-sectional area that gradually increases in a direction along said physical transducing gap with the direction of area increase in one wedge section on one side of said transducing gap being opposite that in the other wedge section on the other side of said transducing gap;

two corresponding magnetic back core portions, each of which is in a proximity to and magnetically coupled with a corresponding one of said front core segments;

an information signal winding magnetically coupled with each of said front core segments for transferring information signal flux with respect to said front core segment;

a control winding magnetically coupled with each of said back core portions for providing a control flux for selectively saturating the associated one of said front core segments at its face portion; and said information signal winding and said control winding being disposed to provide paths for said signal flux and said control flux within said front core segments which are generally transverse to one another.

43. The transducer of claim 42 wherein said signal and control windings are disposed to provide said paths for said signal flux and said control flux within said front core segments which are generally perpendicular to one another.

44. The magnetic transducer of claim 42, wherein:

each of said back core portions is provided in the form of a wedge section similarly oriented as said wedge section provided by said proximate front core segment magnetically coupled therewith; and said back core portions having larger cross-sectional areas in a direction perpendicular to said control flux path than corresponding cross sectional areas of said front core segments.

45. An electromagnetically controlled scanning magnetic transducer comprising:

two corresponding magnetic front core segments defining a physical transducing gap therebetween at face portions of said segments;

two magnetic back core portions, each of which is magnetically coupled with a corresponding one of said front core segments and having lateral surfaces confronting said front core segments, each of said back core portions having a recess provided therein inwardly of said lateral surface for accomodating a control winding;

an information signal winding magnetically coupled with said front core segments for transferring information signal flux with respect to said front core segments;

a control winding arranged in each of said recesses and magnetically coupled with said back core portions for providing a control flux selectively saturating said proximate magnetically coupled front core segments at said face portions; and said information signal winding and control winding being disposed to provide said information signal flux and said control flux extending within said front core segments in generally transverse paths to each other.

46. The transducer of claim 45 wherein said signal and control windings are disposed relative to one another to provide said paths for said signal flux and said control flux within said front core segments which are generally perpendicular to one another.

47. An electromagnetically controlled scanning magnetic transducer comprising:

two corresponding magnetic front core segments defining a physical transducing gap therebetween at face portions of said segments, said front core segments being provided in the form of oppositely oriented wedge sections, each wedge section having a cross-sectional area that gradually increases in a direction along said physical transducing gap with the direction of area increase in one wedge section on one side of said transducing gap being opposite that in the other wedge section on the other side of said transducing gap;

an information signal winding magnetically coupled to said front core segments for transferring information signal flux with respect to said front core segments;

two corresponding magnetic back core portions, each of which has a lateral surface confronting a lateral surface of an associated one said front core segments and being magnetically coupled therewith;

a control winding deposited in the form of a thin film on each of said back core portions, for providing a control flux for selectively saturating the front core segments magnetically coupled therewith at its face portion; and said information signal winding and control winding being disposed to provide said information signal flux and said control flux in paths which extend within said front core segments generally transverse to one another.

48. The transducer of claim 47 wherein said signal and control windings are disposed relative to one another to provide an information signal flux path and a control flux path generally perpendicular to one another within said front core segments.

49. An electromagnetically controlled scanning magnetic transducer comprising:

two corresponding magnetic front core segments defining a physical transducing gap therebetween at face portions of said segments, said front core segments being provided in the form of oppositely oriented wedge sections, each wedge section having a cross-sectional area that gradually increases in a direction along said physical transducing gap with the direction area increase in one wedge section and on one side of said transducing gap being opposite that in the other wedge section on the other side of said transducing gap;

each of said front core segments having a first portion adjacent to said gap, providing a surface to extend substantially in parallel to the path of an associated record medium when the transducer is positioned to record and/or reproduce information signals relative to a record medium and a second portion contiguous with said first portion and defining a facing surface that extends in a direction that diverges away from said path of an associated record medium;

an information signal winding provided in said front core segments for transferring information signal flux with respect to said front core segments;

two corresponding magnetic back core portions having lateral surfaces confronting said front core segments, each of said back core portions being magnetically coupled with an associated one of said front core segments;

a control winding arranged on each of said back core portions for providing a control flux selectively saturating the front core segment magnetically coupled therewith at its face portion; and said information signal winding and control winding being disposed to provide said information signal flux and said control flux in paths which extend within said front core segments generally transverse relative to one another.

50. The transducer of claim 49 wherein said signal and control windings are disposed relative to one another to provide said information signal and control flux paths generally perpendicular to one another within said front core segments.

51. A method of magnetically controlling a magnetic transducer comprising the steps of:

providing a magnetic transducer having magnetic core portions defining two magnetic poles that are spaced apart to provide a physical transducing gap;

providing an information signal winding transferring information signal flux with respect to said core portions;

providing a control flux in said core portions to selectively saturate a face portion of said core portions adjacent to said gap to define adjacent saturated and unsaturated face portions, with said unsaturated face portions overlapping at the transducing gap to provide a transducing zone; and providing said information signal flux and control flux in said core portions to extend along flux paths therein which are generally transverse to one another.

52. The method of claim 51 wherein said information signal and control flux paths generally perpendicular to one another within said core portions.

* * * * *